(12) United States Patent
Sakakibara

(10) Patent No.: US 9,412,826 B2
(45) Date of Patent: Aug. 9, 2016

(54) METHOD FOR MANUFACTURING SEMICONDUCTOR DEVICE USING A SEMICONDUCTOR SUBSTRATE INCLUDING SILICON AND A FIRST CONDUCTIVITY TYPE BODY REGION

(71) Applicant: Akinori Sakakibara, Toyota (JP)

(72) Inventor: Akinori Sakakibara, Toyota (JP)

(73) Assignee: Toyota Jidosha Kabushiki Kaisha, Toyota-shi (JP)

( * ) Notice: Subject to any disclaimer, the term of this patent is extended or adjusted under 35 U.S.C. 154(b) by 0 days.

(21) Appl. No.: 14/611,359

(22) Filed: Feb. 2, 2015

(65) Prior Publication Data

US 2015/0228736 A1  Aug. 13, 2015

(30) Foreign Application Priority Data

Feb. 10, 2014 (JP) ................. 2014-023854

(51) Int. Cl.
*H01L 21/336* (2006.01)
*H01L 21/265* (2006.01)
*H01L 21/266* (2006.01)
(Continued)

(52) U.S. Cl.
CPC ...... *H01L 29/4236* (2013.01); *H01L 21/26506* (2013.01); *H01L 21/32053* (2013.01); *H01L 29/456* (2013.01); *H01L 29/665* (2013.01); *H01L 29/6634* (2013.01); *H01L 29/66348* (2013.01); *H01L 29/7395* (2013.01); *H01L 29/7397* (2013.01); *H01L 29/7802* (2013.01); *H01L 29/7813* (2013.01); *H01L 21/26513* (2013.01); *H01L 21/283* (2013.01); *H01L 29/0696* (2013.01); *H01L 29/1095* (2013.01); *H01L 29/41766* (2013.01); *H01L 29/66727* (2013.01); *H01L 29/66734* (2013.01)

(58) Field of Classification Search
CPC .................... H01L 29/66068; H01L 29/7395; H01L 29/7802; H01L 29/7827
See application file for complete search history.

(56) References Cited

U.S. PATENT DOCUMENTS 6,133,124 A * 10/2000 Horstmann ....... H01L 21/26586
257/E21.165
6,159,856 A * 12/2000 Nagano ............ H01L 21/28518
257/E21.165

(Continued)

FOREIGN PATENT DOCUMENTS

| JP | 2008-205323 A | 9/2008 |
| JP | 2009-535846 A | 10/2009 |
| JP | 4890780 B2 | 3/2012 |
| JP | 2013-058603 A | 3/2013 |
| WO | 2007/133356 A1 | 11/2007 |

*Primary Examiner* — Victor A Mandala
*Assistant Examiner* — Regan J Rundio
(74) *Attorney, Agent, or Firm* — Dinsmore & Shohl LLP

(57) ABSTRACT

A method for manufacturing a semiconductor device includes processes of: (a) implant first conductivity type first impurities in a first region of a first surface; (b) form a second conductivity type semiconductor region exposed in the second region of the first surface by implanting second conductivity type second impurities in the second region; (c) implant charged particles at a dose amount larger than those of the first and the second impurities in a third region of the first surface which at least partially overlaps with the first region and is adjacent to the second region so that an implantation depth of the charged particles becomes shallower than that of the first impurities. After having performed the processes of (a) to (c), a metal is deposited on the second and the third regions, and the metal is caused to react with the semiconductor substrate to form the silicide layer.

3 Claims, 7 Drawing Sheets

(51) Int. Cl.
  *H01L 21/425*   (2006.01)
  *H01L 21/283*   (2006.01)
  *H01L 29/78*    (2006.01)
  *H01L 29/423*   (2006.01)
  *H01L 29/66*    (2006.01)
  *H01L 29/739*   (2006.01)
  *H01L 29/45*    (2006.01)
  *H01L 21/3205*  (2006.01)
  *H01L 29/417*   (2006.01)
  *H01L 29/06*    (2006.01)
  *H01L 29/10*    (2006.01)

(56) References Cited

U.S. PATENT DOCUMENTS

| | | | |
|---|---|---|---|
| 8,367,507 B1 * | 2/2013 | Tsuchiya | H01L 29/1095 257/E21.507 |
| 2006/0226475 A1 | 10/2006 | Yamamoto et al. | |
| 2013/0062622 A1 * | 3/2013 | Tsuchiya | H01L 29/7394 257/77 |
| 2013/0062624 A1 | 3/2013 | Tsuchiya et al. | |

* cited by examiner

METHOD FOR MANUFACTURING SEMICONDUCTOR DEVICE USING A SEMICONDUCTOR SUBSTRATE INCLUDING SILICON AND A FIRST CONDUCTIVITY TYPE BODY REGION

CROSS-REFERENCE TO RELATED APPLICATION

This application claims priority to Japanese Patent Application No. 2014-023854 filed on Feb. 10, 2014, the contents of which are hereby incorporated by reference into the present application.

TECHNICAL FIELD

The present application relates to a semiconductor device and a method for manufacturing the same.

DESCRIPTION OF RELATED ART

Research into refining semiconductor elements has been advanced with the miniaturization of semiconductor devices. When semiconductor elements are refined, a problem occurs that a contact area is reduced between electrodes disposed on a surface of a semiconductor substrate and a semiconductor region, and contact resistance increases. Therefore, a semiconductor device has been developed having a so-called trench contact structure (see Japanese Patent No. 4890780), in which a trench for contact is formed on a surface of a semiconductor substrate, and an electrode that is electrically connected to a surface electrode of the semiconductor substrate is buried within the trench. According to the configuration of Japanese Patent No. 4890780, a contact area between the electrode and the semiconductor region increases by the electrode being in contact with the semiconductor region at a base surface and lateral surfaces of the trench. Therefore, the increase in contact resistance due to refinement of the semiconductor elements can be suppressed.

BRIEF SUMMARY OF INVENTION

In Japanese Patent No. 4890780, the trench for contact is formed using the photolithography technique. That is, patterning is performed on the surface of the semiconductor substrate using a photomask, then the trench is formed by etching. In the method of forming a trench using a photomask, it may happen that the trench cannot be formed at a desired position due to dimensional tolerance of the photomask and/or positional deviation of the photomask, and thus there is a limit to the refinement of the semiconductor elements. In the present description, a technique is provided which enables to form electrodes with low contact resistance as well as enables to refine the semiconductor elements.

The present description disclose a method for manufacturing a semiconductor device using a semiconductor substrate including silicon and a first conductivity type body region. The method comprises processes of (a) to (c) and forming of a silicide layer. The process of (a) implants first conductivity type first impurities in a first region of a first surface of the body region. The process of (b) forms a second conductivity type semiconductor region exposed in a second region of the first surface by implanting second conductivity type second impurities in the second region. The process of (c) implants charged particles at a dose amount larger than a dose amount of the first impurities and larger than a dose amount of the second impurities in a third region of the first surface which at least partially overlaps with the first region and is adjacent to the second region so that an implantation depth of the charged particles becomes shallower than an implantation depth of the first impurities. The forming of the silicide layer deposits a metal on the second region and the third region of the first surface, and reacts the metal with the semiconductor substrate to form the silicide layer after having performed the processes of (a) to (c).

In the manufacturing method of the semiconductor device described above, in the process of (a), the first impurities are implanted in the first region of the surface of the body region. Thereby, a semiconductor region which is exposed in the first region and is having high concentration of first conductivity type impurities (called a semiconductor region A below) is formed. In the process of (b), a second conductivity type semiconductor region exposed in the second region (called a semiconductor region B below) is formed. In the process of (c), charged particles are implanted in the third region which at least partially overlaps with the first region. The dose amount of charged particles at this time is larger than the dose amounts of the first impurities and the second impurities. Consequently, crystal defect density increases in the semiconductor region into which the charged particles were implanted (called a semiconductor region C below). The charged particles are implanted with an implantation depth shallower than the implantation depth of the first impurities. Consequently, in the region where the first region and the third region overlap, the semiconductor region C with the high crystal defect density is formed in a shallow region of the semiconductor region A (a region near the surface of the semiconductor substrate). In the forming of the silicide layer, the metal is deposited on the second region (i.e., the surface of the semiconductor region B) and the third region (i.e., the surface of the semiconductor region C) of the surface, reacting the metal with the semiconductor substrate. The higher the crystal defect density of a region, the greater the reaction rate of the metal and the semiconductor substrate. Consequently, the reaction of the metal and the semiconductor substrate proceeds faster in the semiconductor region C than in the semiconductor region B. Therefore, the silicide layer is formed at a deeper position in the semiconductor region C than in the semiconductor region B. The silicide layer formed in the semiconductor region B makes contact with the surface of the remaining semiconductor region B. The silicide layer formed in the semiconductor region C makes contact with a lateral surface of the remaining semiconductor region B. Thus, the silicide layer formed by the method described above makes contact with both the surface and the lateral surface of the remaining semiconductor region B. Consequently, this silicide layer has low contact resistance with respect to the semiconductor region B. Further, as described above, the semiconductor region A is formed at the back surface side of the semiconductor region C (at a position deeper than the semiconductor region C). Consequently, the silicide layer formed in the semiconductor region C also makes contact with the surface of the semiconductor region A.

As described above, the silicide layer formed by the method described above becomes an electrode in contact with the semiconductor regions A and B. In particular, the silicide layer becomes the electrode in contact with the semiconductor region B with a low resistance. Further, according to this method, the deep (thick) silicide layer is formed in the semiconductor region C in which the charged particles have been implanted. The implantation region of the charged particles can be controlled with higher accuracy than the trench for forming the electrodes as in the prior art. Consequently, according to this manufacturing method, refinement of the semiconductor elements is possible.

Moreover, "implantation depth" in the process of (c) means an average depth at which the entry of implanted substances stops. Further, "the third region adjacent to the second region" includes a case where a portion of the third region is adjacent to the second region, and the other portion of the third region overlaps with the second region. Further, the processes of (a), (b) and (c) described above may be performed in any order.

The present description also discloses a semiconductor device comprising a semiconductor substrate which includes silicon and has a first surface and a second surface that is on an opposite side of the first surface. The semiconductor device has a silicide layer disposed on the first surface of the semiconductor substrate. The semiconductor device comprises a first conductivity type first semiconductor region, a second conductivity type second semiconductor region, a second conductivity type drift region, a gate trench, an insulating layer, and a gate electrode. The first semiconductor region is in contact with the silicide layer. The second semiconductor region is in contact with the silicide layer and the first semiconductor region. The drift region is positioned on a second surface side of the first semiconductor region and is separated from the second semiconductor region by the first semiconductor region. The gate trench is penetrating the first semiconductor region and the second semiconductor region to extend to the drift region. The insulating layer is disposed inside the gate trench. The gate electrode is disposed inside the gate trench and is facing the first semiconductor region across the insulating layer. The silicide layer includes a first portion, a second portion, and a third portion. The first portion is in contact with a first surface of the second semiconductor region. The second portion is extending to a deeper position than the first portion and is in contact with a lateral surface of the second semiconductor region. The third portion is extending to a position deeper than the first portion and shallower than the second portion and is in contact with a first surface of the first semiconductor region.

In this semiconductor device, the contact resistance of the silicide layer is reduced.

DETAILED DESCRIPTION OF INVENTION (Semiconductor Device 10)

Figure 1:
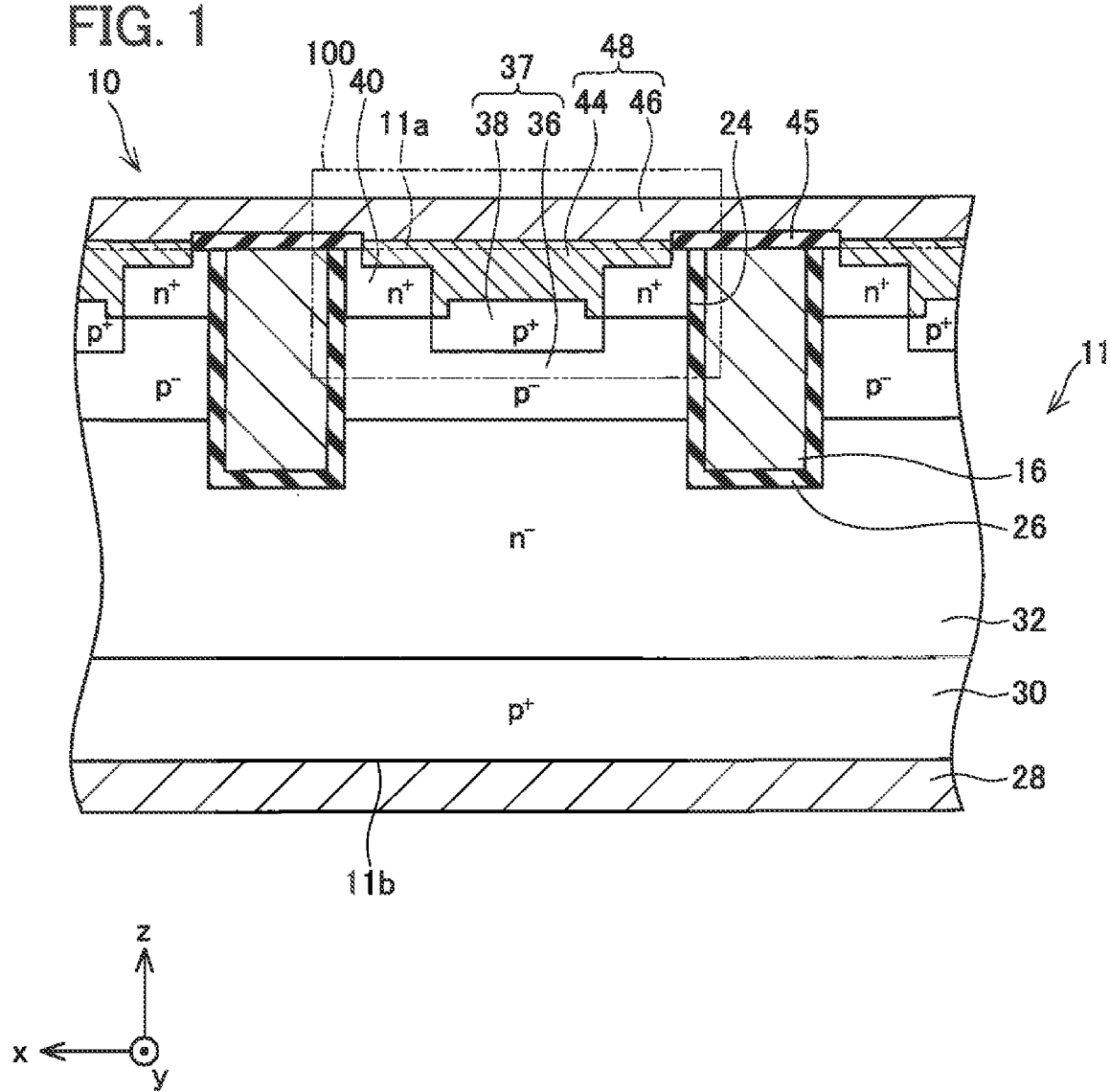
FIG. 1 shows a longitudinal sectional view of a semiconductor device of embodiment 1.

As shown in FIG. 1, a semiconductor device 10 of the present embodiment comprises a semiconductor substrate 11 formed from silicon (Si). Note that, in the description below, z direction means a direction of thickness of the semiconductor substrate 11, x direction means a direction perpendicular to the z direction, and y direction means a direction perpendicular to the x direction and the z direction. A plurality of silicide electrodes 44 are formed on an upper surface 11a of the semiconductor substrate 11 (the surface indicated by the two-dot chain line of FIG. 1). Each silicide electrode 44 extends long along with the y direction. Each silicide electrode 44 is formed from nickel silicide (NiSi).

An n+ type emitter region 40 is formed below each silicide electrode 44. The emitter region 40 is formed below both ends of the silicide electrode 44 in the x direction. The emitter region 40 is in ohmic contact with the silicide electrode 44.

Body regions 37 are formed below the silicide electrodes 44 and the emitter regions 40. Each body region 37 makes contact with the corresponding silicide electrode 44 and emitter region 40. Each body region 37 has a contact region 38 which has a high concentration of p type impurities, and a low concentration region 36 which has a lower concentration of p type impurities than the contact region 38. The contact region 38 is formed below a central portion of the corresponding silicide electrode 44 in the x direction. The contact region 38 is in ohmic contact with the corresponding silicide electrode 44. The low concentration region 36 is formed below the corresponding emitter region 40 and contact region 38. The low concentration region 36 makes contact with the corresponding emitter region 40 and contact region 38.

An n− type drift region 32 is formed below the body regions 37. The drift region 32 is separated from the emitter regions 40 and the contact regions 38 by the low concentration regions 36. The impurity concentration of the drift region 32 is lower than the impurity concentration of the emitter regions 40.

A p+ type collector region 30 is formed below the drift region 32. The collector region 30 is formed in a region facing a lower surface 11b of the semiconductor substrate 11. The impurity concentration of the collector region 30 is higher than the impurity concentration of the low concentration regions 36. The collector region 30 is in contact with the drift region 32. The collector region 30 is separated from the low concentration regions 36 by the drift region 32.

A plurality of gate trenches 24 are formed in the upper surface 11a of the semiconductor substrate 11. Each gate trench 24 extends long along with the y direction. Each gate trench 24 penetrates the emitter region 40 and the body region 37 from the upper surface 11a of the semiconductor substrate 11, and reaches the drift region 32. An inner surface of each gate trench 24 is covered with a gate insulating layer 26. A gate electrode 16 is formed within each gate trench 24. A lower end of each gate electrode 16 is disposed at a position deeper than a lower surface of the body region 37. The gate electrode 16 is insulated from the semiconductor region by the insulating layer 26. The gate electrode 16 faces the body region 37 and the emitter region 40 via the insulating layer 26. An upper surface of the gate electrode 16 is covered with a cap insulating layer 45.

A collector electrode 28 is formed on the lower surface 11b of the semiconductor substrate 11. The collector electrode 28 is formed on the entire lower surface 11b of the semiconductor substrate 11. The collector electrode 28 is in ohmic contact with the collector region 30.

An aluminum electrode 46 is formed on upper surfaces of the silicide electrodes 44 and on upper surfaces of the cap insulating layers 45. The silicide electrodes 44 are electrically connected to the aluminum electrode 46. Each silicide electrode 44 and the aluminum electrode 46 constitute an emitter electrode 48. The emitter electrodes 48 are insulated from the gate electrodes 16 by the cap insulating layers 45.

Figure 2:
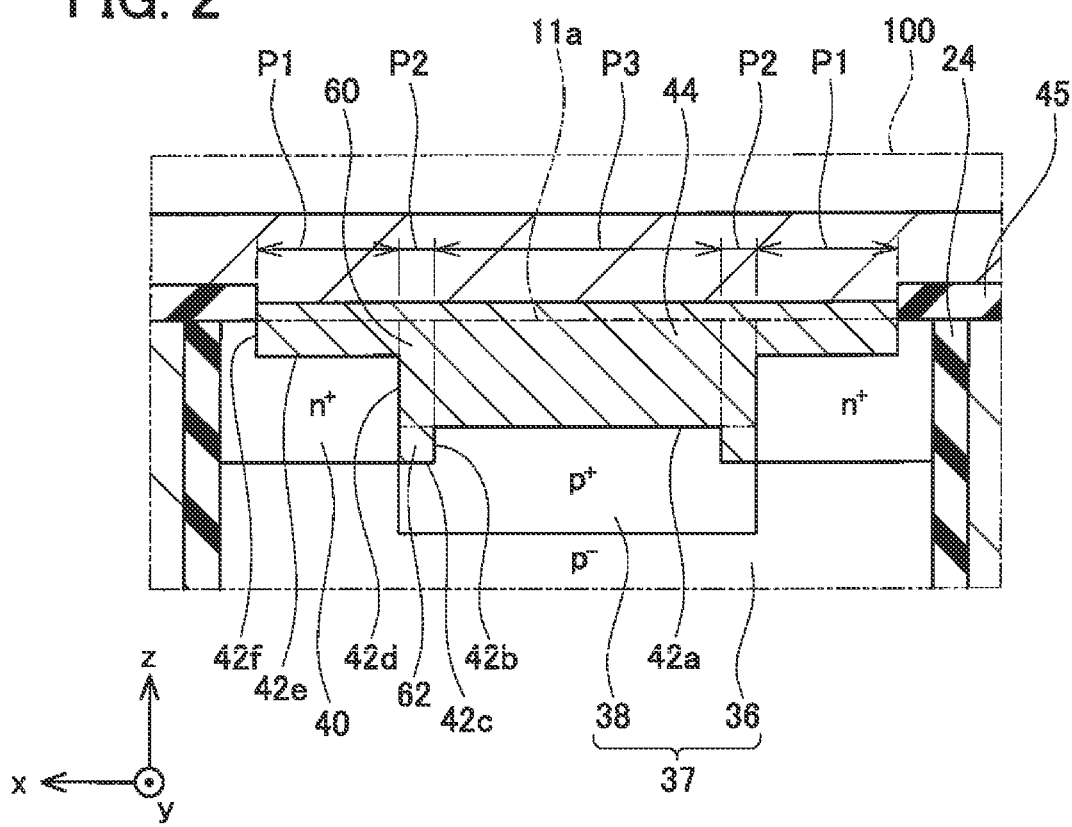
FIG. 2 shows an enlarged cross-sectional view of a region 100 of embodiment 1.

The positional relationship of each set of the silicide electrode 44, the emitter region 40 and the contact region 38 will be described in more detail with reference to FIG. 2. As shown in FIG. 2, the silicide electrode 44 is formed between adjacent gate trenches 24 (strictly speaking, between respective end surfaces of adjacent cap insulating layers 45). The silicide electrode 44 extends to a predetermined depth from the upper surface 11a of the semiconductor substrate 11. As shown, the depth of the silicide electrode 44 (i.e., a distance from an upper end to a lower end of the silicide electrode 44) changes in accordance with a position in the x direction. The silicide electrode 44 can be divided into portions P1, P2, P3 depending on its depth. The portion P3 is a central portion of the silicide electrode 44 in the x direction, the portion P1 is a portion closest to the gate trenches 24 (i.e., defining end portions of the silicide electrode 44 in the x direction), and the portion P2 is a portion between the portion P3 and the portion P1. The depth of the silicide electrode 44 is the shallowest at the portion P1, and the deepest at the portion P2. The depth of the portion P3 is shallower than the portion P2, and is deeper than the portion P1. The portion P1 is disposed above the emitter region 40. The emitter region 40 makes contact with a lateral surface 42f and a lower surface 42e of the silicide electrode 44 at the portion P1, and a lateral surface 42d of the silicide electrode 44 at the portion P2. The portions P2 and P3 are disposed above the contact region 38. In a plan view of the upper surface 11a of the semiconductor substrate 11, a region occupied by the contact region 38 matches a region occupied by the portion P2 and the portion P3 of the silicide electrode 44. The contact region 38 makes contact with a lower surface 42c and a lateral surface 42b of the silicide electrode 44 at the portion P2, and a lower surface 42a of the silicide electrode 44 at the portion P3.

Figure 3:
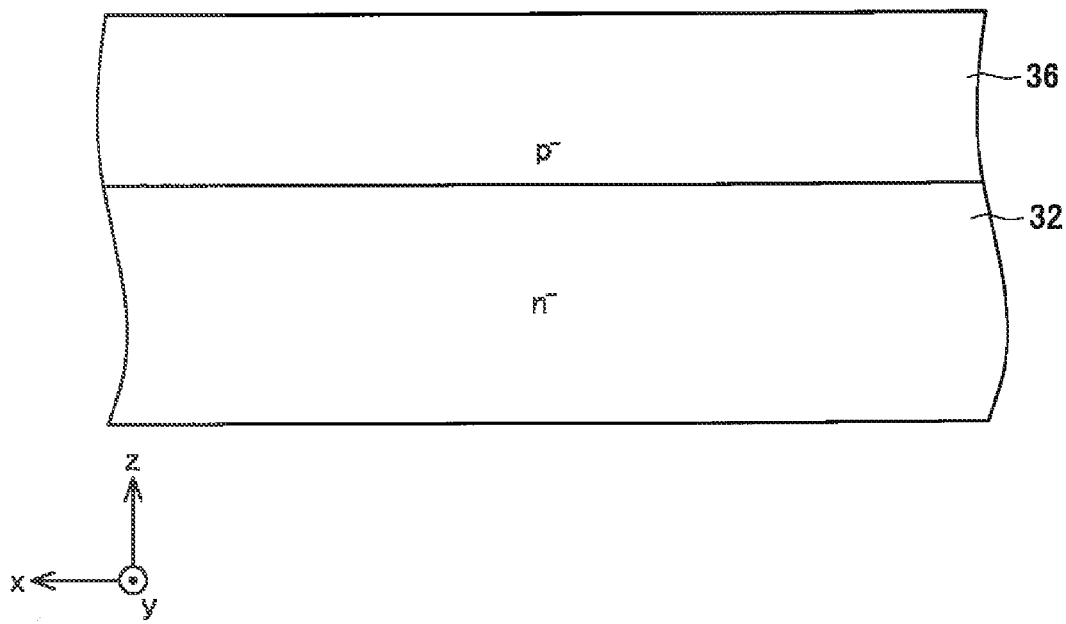
FIG. 3 shows a manufacturing method of the semiconductor device of embodiment 1, and shows a state of a low concentration region having been formed.

Next, the manufacturing method of the semiconductor device 10 will be described with reference to FIG. 3 to FIG. 8. First, as shown in FIG. 3, the p− type low concentration region 36 is formed by ion implantation or the like so as to be exposed in the upper surface 11a of the semiconductor substrate 11 (a silicon wafer) having the n− type drift region 32.

Figure 4:
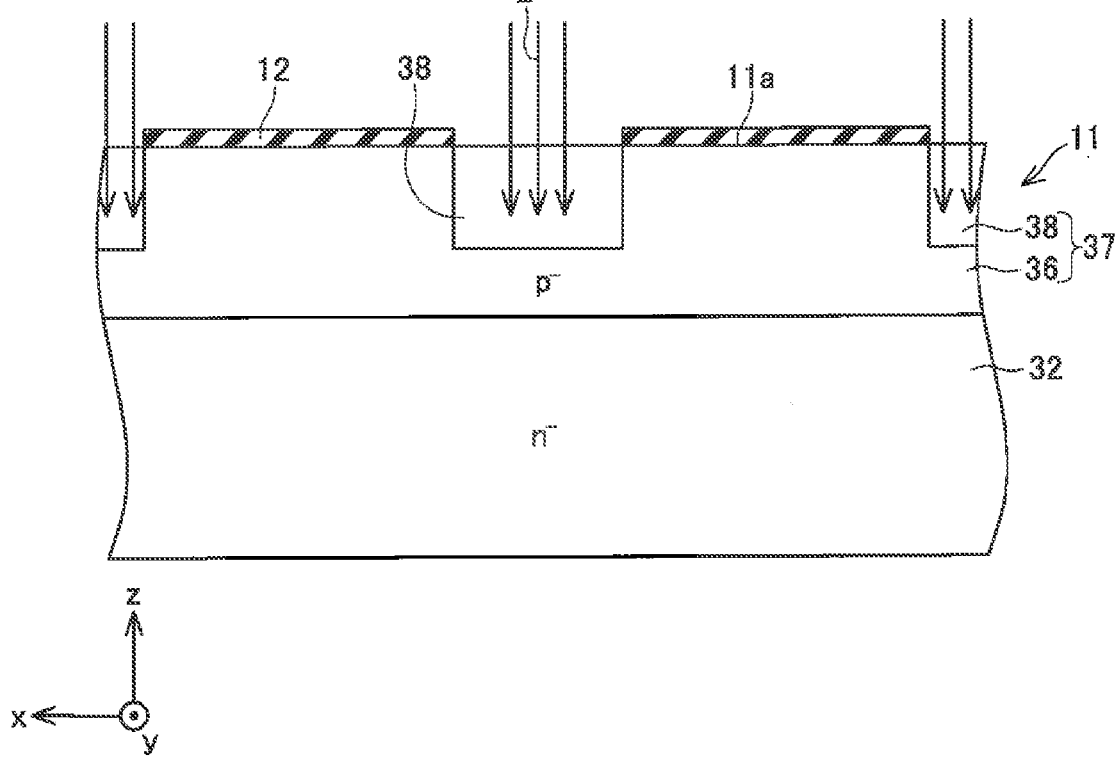
FIG. 4 shows the manufacturing method of the semiconductor device of embodiment 1, and shows a state of first impurities having been implanted.

Next, as shown in FIG. 4, a mask 12 is formed on the upper surface 11a of the semiconductor substrate 11, and implantation of boron ions B toward the upper surface 11a is performed. The boron ions B are implanted in the semiconductor substrate 11 within the openings of the mask 12. Thus, the concentration of p type impurities in the ion implantation regions increases, and high concentration regions 38 (i.e., the contact regions 38) are formed.

Figure 5:
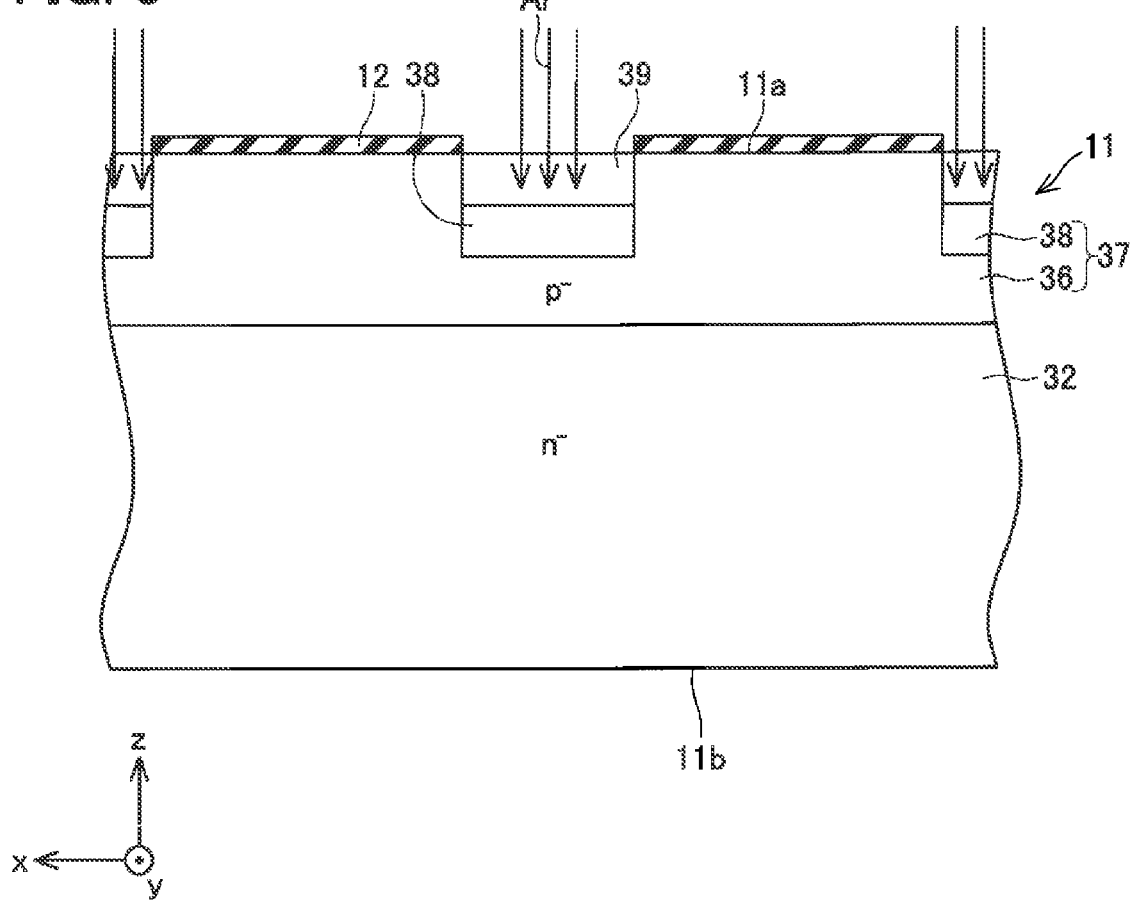
FIG. 5 shows the manufacturing method of the semiconductor device of embodiment 1, and shows a state of charged particles having been implanted.

Next, as shown in FIG. 5, implantation of argon ions Ar toward the upper surface 11a of the semiconductor substrate 11 is performed using the same mask 12 as for the implantation of boron ions B. The argon ions Ar are implanted in the semiconductor substrate 11 within the openings of the mask 12. That is, the argon ions Ar are implanted in the same regions of the upper surface 11a as the implantation regions of the boron ions B. The dose amount of argon is considerably larger than the dose amount of boron. For example, the dose amount of argon may be ten times as large as the dose amount of boron. Specifically, the concentration of argon in regions 39 is approximately $1.0 \times 10^{20}$ [$cm^{-3}$]. Therefore, crystal defects are formed at a high density in the regions in which argon was implanted. Thereby, the high density crystal defect regions 39 are formed which have a large number of crystal defects in the regions in which argon was implanted. Further, here, the ion implantation of argon is performed with lower implantation energy than implantation energy of when the ion implantation of boron is performed. Consequently, the average stopping position of argon is shallower than the average stopping position of boron. Therefore, the high density crystal defect regions 39 are formed at a position shallower than the lower surfaces of the high concentration regions 38.

Figure 6:
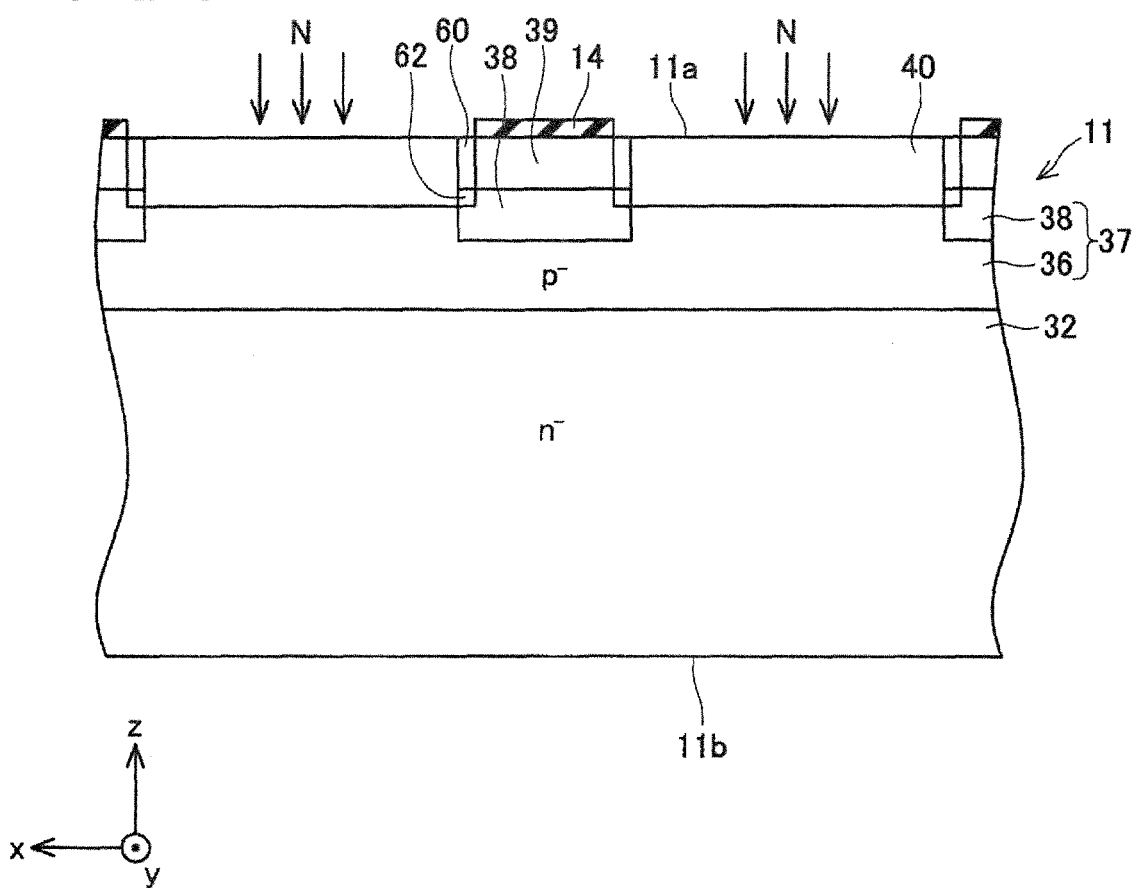
FIG. 6 shows the manufacturing method of the semiconductor device of embodiment 1, and shows a state of second impurities having been implanted.

Next, the mask 12 is removed and, as shown in FIG. 6, a mask 14 is formed on the upper surface 11a of the semiconductor substrate 11. The mask 14 is formed on the high density crystal defect regions 39. Further, the width of the mask 14 (i.e., a length in the x direction) is shorter than the width of the high density crystal defect regions 39. Next, nitrogen ions N are implanted toward the upper surface 11a of the semiconductor substrate 11. The nitrogen ions N are implanted in the semiconductor substrate 11 within the openings of the mask 14. Thereby, the n type emitter regions 40 are formed in the ion implantation regions. Since the width of the mask 14 is shorter than the width of the high density crystal defect regions 39, each high density crystal defect region 39 is exposed at both sides of the mask 14 in the x direction. Therefore, the implantation regions of nitrogen partially overlap with the implantation regions of boron (i.e., the high concentration regions 38) and the implantation regions of argon (i.e., the high density crystal defect regions 39). Further, nitrogen is implanted with implantation energy lower than the implantation energy of boron and higher than the implantation energy of argon. Therefore, the depth of the emitter regions 40 becomes shallower than the high concentration regions 38, and deeper than the high density crystal defect regions 39. Below, the regions 60 in which boron, nitrogen and argon are implanted are called the overlapping regions 60, and the regions 62 in which boron and nitrogen are implanted are called the overlapping regions 62. The overlapping regions 62 are positioned below the overlapping regions 60.

After the ion implantation described above, an annealing process is performed, restoring crystal defects caused by ion implantation, and activating the impurities in the emitter regions 40 and the body region 37. Note that, crystal defects remain in the semiconductor substrate 11 even after the annealing process. In particular, since crystal defects are present with an extremely high density in the high density crystal defect regions 39, many crystal defects remain in the high density crystal defect regions 39 even after the annealing process.

Figure 7:
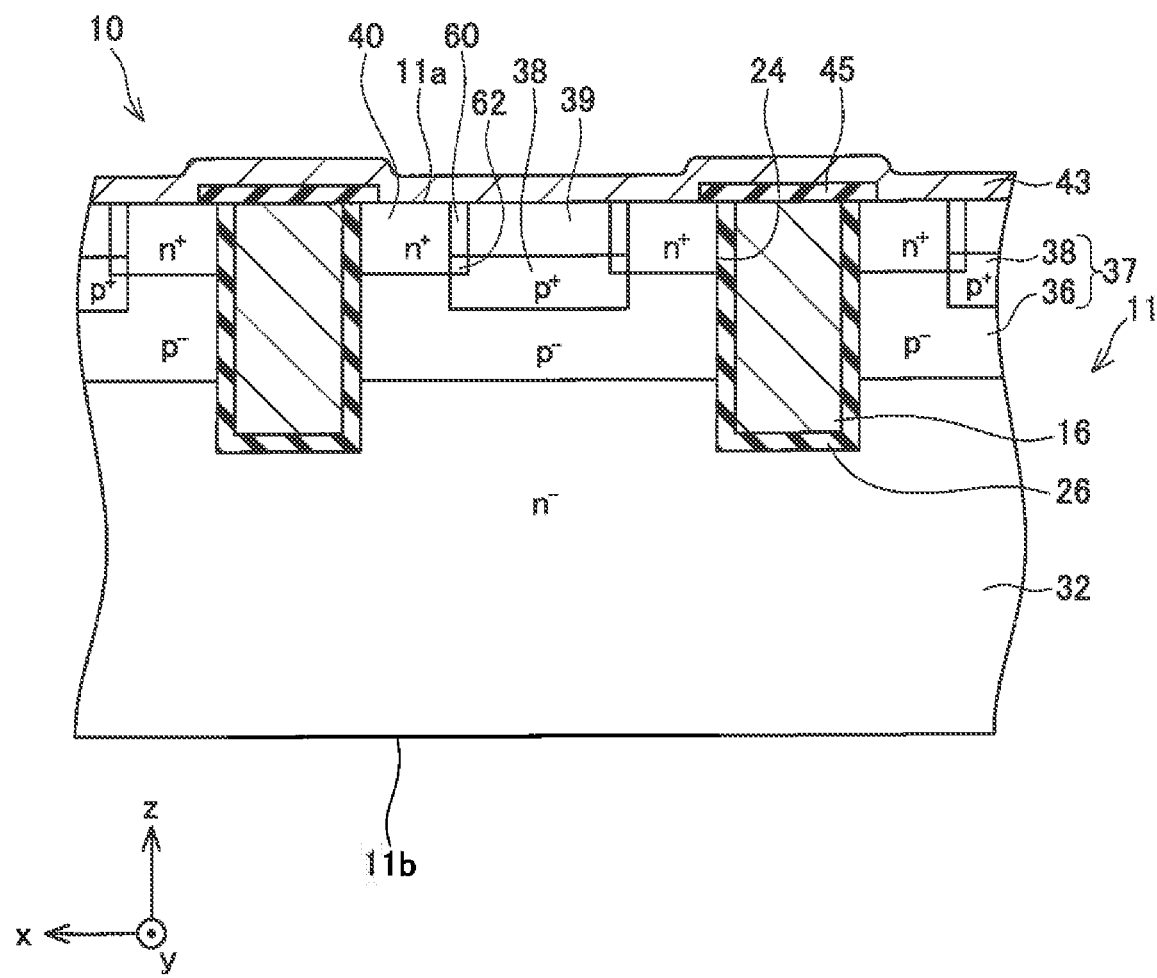
FIG. 7 shows the manufacturing method of the semiconductor device of embodiment 1, and shows a state of metal having been deposited on a surface of a semiconductor substrate.
Figure 8:
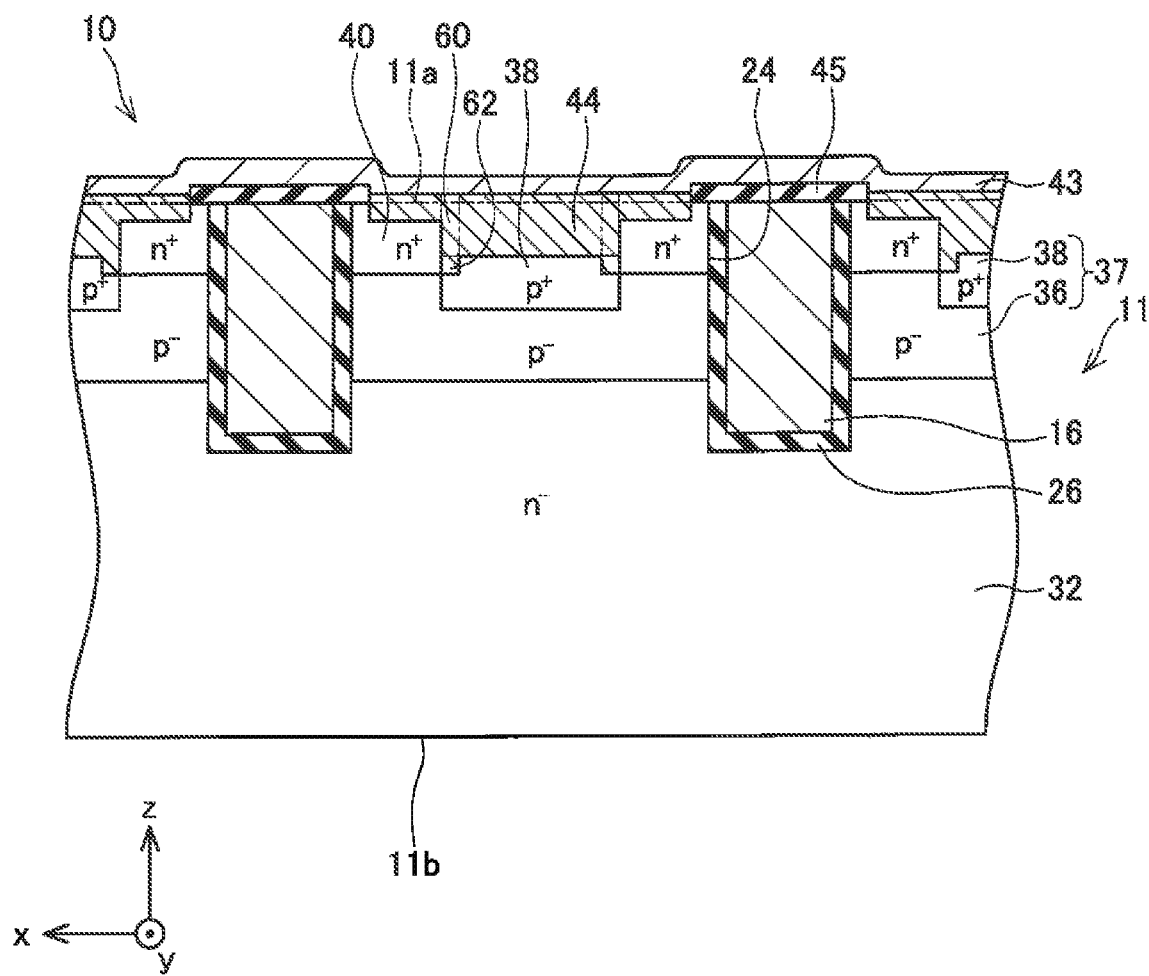
FIG. 8 shows the manufacturing method of the semiconductor device of embodiment 1, and shows a state of a silicide layer having been formed by reacting the metal with the semiconductor substrate.

Next, after removing the mask 14, as shown in FIG. 7, the gate trenches 24, the insulating layers 26, the gate electrodes 16, and the cap insulating layers 45 are formed in the semiconductor substrate 11. Then, a metal 43 is deposited on the upper surface 11a of the semiconductor substrate 11 (in other words, the upper surfaces of the emitter regions 40 and the upper surfaces of the high density crystal defect regions 39), and a first annealing process is performed. Nickel (Ni) is used as the metal 43. Thereby, as shown in FIG. 8, the metal 43 is caused to react with the Si of the semiconductor substrate 11, forming the silicide electrodes 44 made of nickel silicide. The annealing process is performed until the silicide electrodes 44 are formed at least at the lower surfaces of the high density crystal defect regions 39 (i.e., until the silicide reaction proceeds to at least the depth of the lower surfaces of the high density crystal defect regions 39).

The higher the crystal defect density of the region of the semiconductor substrate 11, the faster the silicide reaction proceeds. Therefore, the silicide reaction proceeds faster in the high density crystal defect regions 39 than in the emitter regions 40. Consequently, the silicide electrodes 44 formed in the high density crystal defect regions 39 (i.e., above the high concentration region 38) are formed so as to extend to a position deeper than the silicide electrodes 44 formed above the emitter regions 40.

Moreover, the crystal defect density in the overlapping regions 60 is particularly high among the high density crystal defect regions 39. This is because boron, nitrogen and argon are implanted in the overlapping regions 60. Therefore, the silicide reaction proceeds faster in the overlapping regions 60 than in the high density crystal defect regions 39 outside the overlapping regions 60. Furthermore, since boron and argon are implanted in the overlapping regions 62, the crystal defect density in the overlapping regions 62 is higher than that in the high concentration regions 38 in which only boron is implanted. Thus, the silicide reaction proceeds faster in the overlapping regions 62 than in the high concentration regions 38. Therefore, each silicide electrode 44 in the overlapping regions 60, 62 is formed so as to extend to the position deeper than the silicide electrode 44 in the high density crystal defect region 39 positioned between the overlapping regions 60, 62. Thus, as shown in FIG. 2, the position of the lower end of each silicide electrode 44 is deeper at the portion P2 than at the portion P3, and is deeper at the portion P3 than at the portion P1. Consequently, the lateral surface 42*d* of the silicide electrode 44 at the portion P2 makes contact with the emitter region 40, and the lateral surface 42*b* of the silicide electrode 44 at the portion P2 makes contact with the high concentration region 38.

After the first annealing process finishes, the metal 43 that did not react with the semiconductor substrate 11 is removed using a chemical solution, and a second annealing process is performed. The second annealing process is performed at a higher temperature than the first annealing process.

Then, as shown in FIG. 1, the aluminum electrode 46 is formed on the upper surface of the silicide electrode 44. Each emitter electrode 48 is formed by corresponding silicide electrode 44 and the aluminum electrode 46. Next, the collector region 30 is formed by performing ion implantation toward the lower surface 11*b* of the semiconductor substrate 11. Next, the collector electrode 28 is formed on the lower surface 11*b* of the semiconductor substrate 11. By performing the above processes, the semiconductor device 10 is manufactured.

As described above, in the manufacturing method of the semiconductor device 10, the high density crystal defect regions 39 that include many crystal defects are intentionally formed in the regions exposed in the upper surface 11*a* of the semiconductor substrate 11, and the contact regions 38 are formed at the lower surfaces of the high density crystal defect regions 39, and the emitter regions 40 are formed at the lateral surfaces of the high density crystal defect regions 39. Then, by performing the annealing process after depositing nickel on the upper surface 11*a* of the semiconductor substrate 11, the nickel reacts with the semiconductor substrate 11 (silicide reaction), resulting in forming the silicide electrodes 44. The higher the crystal defect density of a region, the faster the silicide reaction proceeds. Thus, the thickness of the silicide electrodes 44 formed in the high density crystal defect regions 39 is greater than the thickness of the silicide electrodes 44 formed in the emitter regions 40, creating a step in the silicide electrodes 44 (see FIG. 2). As a result, each emitter region 40 makes contact not only at its upper surface with the corresponding silicide electrode 44, but also makes contact at its lateral surface with the lateral surface 42*d* of the step of the corresponding silicide electrode 44. Therefore, according to this method, the silicide electrodes 44 which have low contact resistance with respect to the emitter regions 40 can be formed.

Further, the high density crystal defect regions 39 formed by ion implantation can be formed with high accuracy. Therefore, the silicide electrodes 44 that extend to a deep position (i.e., the silicide electrodes 44 of the portions P2 and P3) can be formed with high accuracy. In particular, in the manufacturing method of the embodiment, the ion implantation for the high density crystal defect regions 39 is performed using the same mask as in the ion implantation for the high concentration regions 38. Thus, it becomes possible to form the silicide electrodes 44 that extend to the deep position in a self-aligned manner on the high concentration regions 38. Consequently, according to this method, the silicide electrodes 44 that extend to the deep position can be formed with high accuracy on the high concentration regions 38, and thus the semiconductor elements can be further refined.

Further, in the manufacturing method of embodiment 1, the implantation regions of argon and the implantation regions of nitrogen overlap at the overlapping regions 60. Further, according to the manufacturing method of embodiment 1, the emitter regions 40 are formed so that the depth thereof may be deeper than the depth of the high density crystal defect regions 39. Thus, the implantation regions of boron and the implantation regions of nitrogen overlap at the overlapping regions 62. Therefore, the locally deep silicide electrodes 44 (i.e., portion P2) can be formed. As a result, the contact regions 38 make contact not only with the lower surfaces 42*a* of the silicide electrodes 44, but also with the lateral surfaces 42*b* of the silicide electrodes 44. Therefore, the contact resistance between the contact regions 38 and the silicide electrodes 44 can be reduced.

Further, in case of forming a contact trench in the semiconductor substrate, and then forming a metal layer therein, as in the prior art, there is a problem that it is difficult to form the metal layer on a side wall of the contact trench because metal particles have a high tendency to travel in a straight manner during film formation, and thus it is difficult to reduce the contact resistance of the semiconductor region. The manufacturing method of embodiment 1 can prevent such a problem from happening. The contact regions 38 and the emitter regions 40 reliably make contact with the lateral surface of the silicide electrodes 44. Therefore, the contact resistance of these regions 38, 40 can reliably be reduced.

Further, according to the manufacturing method of embodiment 1, the ion implantation of argon is performed using the same mask as when the ion implantation of boron is performed. Thus, it is not necessary to prepare a new mask for the ion implantation of argon, and therefore the high density crystal defect regions 39 can be formed at low cost.

Moreover, in the embodiment described above, the implantation regions of each ion are set so as to form the overlapping regions 62. However, the overlapping regions 62 may not be formed. That is, the implantation depth of boron for forming the emitter regions 40 may be shallower than the implantation depth of argon for forming the high density crystal defect regions 39. With this configuration, as long as the overlapping regions 60 are formed, a deep silicide electrode 44 can be formed at each portion P2.

Further, in the embodiment described above, the implantation region of each ion is set so as to form the overlapping region 60. However, the overlapping regions 60 may not be formed. In this case, the portion P2 is not formed in each silicide electrode 44. With this configuration, since the portion P3 is formed to be deeper than the portion P1, the emitter region 40 makes contact with the silicide electrode 44 at its upper surface and its lateral surface. Therefore, the contact resistance between the silicide electrode 44 and the emitter region 40 can be reduced.

Further, in the embodiment described above, the same mask is used in the implantation of boron and the implantation of argon. However, a different mask may be used in the implantation of argon from in the implantation of boron. With this configuration, since a mask for ion implantation can be formed with high accuracy, the implantation regions of argon can be controlled with high accuracy. Thus, the semiconductor elements can be refined.

Further, in the embodiment described above, nitrogen is implanted in a region which overlaps with the implantation region of boron. However, these implantation regions need not overlap. Further, these implantation regions may be separate from each other. Even with this configuration, as long as argon is implanted at positions adjacent to the implantation regions of nitrogen, the high density crystal defect regions 39 are formed adjacent to the emitter regions 40. That is, the deep silicide electrode 44 is formed adjacent to the corresponding emitter region 40. Consequently, the emitter region 40 can be in contact with the lateral surface of the silicide electrode 44. With this configuration, the contact resistance between the silicide electrode 44 and the emitter region 40 can be reduced.

The embodiment disclosed by the present description was explained in detail above, but this embodiment is simply an example and the semiconductor device and the method for manufacturing the same disclosed by the present description include various modifications of the abovementioned embodiment. For example, in performing the ion implantation, a rare gas, such as xenon, may be implanted instead of argon, or p type impurities or n type impurities may be implanted. That is, the type of substance to be implanted does not matter as long as the substance can make the crystal defect density of the regions 39 higher than the crystal defect density of the other semiconductor regions. Further, the manufacturing method described above is not restricted to a manufacturing method for IGBT, but may be used in a manufacturing method for n type/p type MOSFETs or other semiconductor elements. Further, the metal 43 may be a metal such as Ti.

Some aspects of the teaching disclosed herein will further be described. In one aspect of the present teachings, the implantation of the first impurities and the implantation of the charged particles may be performed using a same mask and the second region and the third region may partially overlap. According to this manufacturing method, the reaction of the metal and the semiconductor substrate proceeds faster in a region where the second region and the third region overlap (called an overlapping region below) than in a region where the second and third region do not overlap. Thus, the silicide layer formed in the overlapping region can make wider contact with the implantation region of the first impurities. Consequently, contact resistance between the silicide layer and the implantation region of the first impurities can be reduced.

In another aspect of the present teachings, an implantation depth of the second impurities may be deeper than the implantation depth of the charged particles. According to this method, the contact area of the silicide layer and the implantation region of the first impurities can be further increased.

Specific examples of the present invention have been described in detail, however, these are mere exemplary indications and thus do not limit the scope of the claims. The art described in the claims includes modifications and variations of the specific examples presented above. Technical features described in the description and the drawings may technically be useful alone or in various combinations, and are not limited to the combinations as originally claimed. Further, the art described in the description and the drawings may concurrently achieve a plurality of aims, and technical significance thereof resides in achieving any one of such aims.

What is claimed is:

1. A method for manufacturing a semiconductor device using a semiconductor substrate including silicon and a first conductivity type body region, the method comprising:
    (a) implanting first conductivity type first impurities in a first region of a first surface of the body region;
    (b) forming a second conductivity type semiconductor region exposed in a second region of the first surface by implanting second conductivity type second impurities in the second region;
    (c) implanting charged particles at a dose amount larger than a dose amount of the first impurities and larger than a dose amount of the second impurities in a third region of the first surface which at least partially overlaps with the first region and is adjacent to the second region so that an implantation depth of the charged particles becomes shallower than an implantation depth of the first impurities; and
    depositing a metal on the second region and the third region of the first surface, and reacting the metal with the semiconductor substrate to form a silicide layer after having performed the processes of (a) to (c),
    wherein the implantation of the first impurities and the implantation of the charged particles are performed using a same mask.

2. A method according to claim 1, wherein the second region and the third region partially overlap.

3. A method according to claim 2, wherein an implantation depth of the second impurities is deeper than the implantation depth of the charged particles.

* * * * *